(12) United States Patent
Allen et al.

(10) Patent No.: US 9,099,462 B2
(45) Date of Patent: Aug. 4, 2015

(54) SIGNAL PATH AND METHOD OF MANUFACTURING A MULTIPLE-PATTERNED SEMICONDUCTOR DEVICE

(71) Applicant: International Business Machines Corporation, Armonk, NY (US)

(72) Inventors: David H. Allen, Rochester, MN (US); Douglas M. Dewanz, Rochester, MN (US); David P. Paulsen, Dodge Center, MN (US); John E. Sheets, II, Zumbrota, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/788,049

(22) Filed: Mar. 7, 2013

(65) Prior Publication Data

US 2014/0183603 A1  Jul. 3, 2014

Related U.S. Application Data

(63) Continuation of application No. 13/732,721, filed on Jan. 2, 2013, now Pat. No. 8,866,306.

(51) Int. Cl.
*H01L 23/48* (2006.01)
*H01L 23/52* (2006.01)
(Continued)

(52) U.S. Cl.
CPC .............. *H01L 23/52* (2013.01); *H01L 21/486* (2013.01); *H01L 22/22* (2013.01); *H01L 23/528* (2013.01); *H01L 27/0207* (2013.01); *H01L 22/12* (2013.01); *H01L 22/14* (2013.01); *H01L 23/5286* (2013.01); *H01L 2924/0002* (2013.01)

(58) Field of Classification Search
CPC ........ H01L 22/12; H01L 21/486; H01L 29/72
USPC .......... 257/664, 775, 776, E31.032, E29.022; 438/174, 618; 716/30–129
See application file for complete search history.

(56) References Cited

U.S. PATENT DOCUMENTS 4,308,090 A   12/1981   Te Velde et al.
5,561,317 A   10/1996   Momma et al.
(Continued)

FOREIGN PATENT DOCUMENTS

JP        2002151592 A      5/2002

OTHER PUBLICATIONS

Mack, C., "Semiconductor Lithography", Chris Mack, Gentleman Scientist, pp. 1-12. http://www.lithoguru.com/scientist/lithobasics.html.

(Continued)

*Primary Examiner* — Jarrett Stark
*Assistant Examiner* — Shahed Ahmed
(74) *Attorney, Agent, or Firm* — Peder M. Jacobson; Robert R. Williams

(57) ABSTRACT

A multiple-patterned semiconductor device and a method of manufacture are provided. The semiconductor device includes one or more layers with signal tracks. The signal tracks have a quality characteristic. The semiconductor device also includes repeater banks to repower signals. The method of manufacture includes defining portions of layers with photomasks having signal track patterns, determining a quality characteristic of the signal track patterns, and selecting a photomask for etching vias.

11 Claims, 15 Drawing Sheets

(51) Int. Cl.
    *H01L 23/528*     (2006.01)
    *H01L 21/48*     (2006.01)
    *H01L 27/02*     (2006.01)
    *H01L 21/66*     (2006.01)

(56) References Cited

U.S. PATENT DOCUMENTS

| | | | |
|---|---|---|---|
| 5,841,664 A | 11/1998 | Cai et al. | |
| 5,888,676 A | 3/1999 | Saitoh | |
| 6,175,138 B1 * | 1/2001 | Noda | 257/392 |
| 6,496,035 B2 | 12/2002 | Jensen et al. | |
| 6,611,944 B2 | 8/2003 | Elzinga | |
| 6,841,465 B2 | 1/2005 | Choi | |
| 7,047,514 B2 | 5/2006 | Mizuno et al. | |
| 7,139,152 B2 | 11/2006 | Mahnad et al. | |
| 7,216,314 B2 | 5/2007 | Decloedt | |
| 7,239,174 B2 | 7/2007 | Madurawe | |
| 7,323,717 B2 | 1/2008 | Koyama et al. | |
| 7,334,208 B1 | 2/2008 | Cox | |
| 7,523,436 B2 | 4/2009 | Mizuno et al. | |
| 7,739,624 B2 | 6/2010 | McElvain et al. | |
| 7,781,149 B2 | 8/2010 | Paxton et al. | |
| 7,861,196 B2 | 12/2010 | Huckabay et al. | |
| 8,236,663 B2 | 8/2012 | Coolbaugh et al. | |
| 8,386,979 B2 * | 2/2013 | McElvain et al. | 716/115 |
| 8,448,120 B2 | 5/2013 | Huang et al. | |
| 8,468,484 B2 | 6/2013 | Lilja | |
| 8,475,872 B2 | 7/2013 | Kang et al. | |
| 8,531,203 B2 | 9/2013 | Christensen et al. | |
| 8,533,641 B2 | 9/2013 | Park et al. | |
| 8,558,286 B2 | 10/2013 | Tian et al. | |
| 8,560,998 B1 | 10/2013 | Salowe et al. | |
| 8,572,522 B2 | 10/2013 | Iwase et al. | |
| 8,578,304 B1 | 11/2013 | Behrends et al. | |
| 8,601,411 B2 | 12/2013 | Chen et al. | |
| 8,703,574 B2 | 4/2014 | Gaynor et al. | |
| 8,709,684 B2 | 4/2014 | Chern et al. | |
| 2008/0192164 A1 | 8/2008 | Jung et al. | |
| 2009/0283903 A1 | 11/2009 | Park | |
| 2010/0199253 A1 | 8/2010 | Cheng et al. | |
| 2011/0006998 A1 | 1/2011 | Kang et al. | |
| 2011/0014786 A1 | 1/2011 | Sezginer et al. | |
| 2011/0207328 A1 | 8/2011 | Speakman | |
| 2012/0025403 A1 | 2/2012 | Yokogawa | |
| 2012/0119304 A1 | 5/2012 | Sugimae et al. | |
| 2012/0151430 A1 | 6/2012 | Emmanuel et al. | |
| 2012/0193814 A1 | 8/2012 | Dunne et al. | |
| 2013/0032885 A1 | 2/2013 | Swamynathan et al. | |
| 2013/0149638 A1 | 6/2013 | Ogadhoh et al. | |
| 2013/0154128 A1 | 6/2013 | Wang et al. | |
| 2013/0175631 A1 | 7/2013 | Behrends et al. | |
| 2013/0244427 A1 | 9/2013 | Yuan et al. | |
| 2013/0263065 A1 | 10/2013 | Chen et al. | |
| 2013/0295727 A1 | 11/2013 | Hsu et al. | |

OTHER PUBLICATIONS

Allen, et al., "Signal Path of a Multiple-Patterned Semiconductor Device", filed Jan. 2, 2013. U.S. Appl. No. 13/732,525.

Mack, C., "Semiconductor Lithography", Chris Mack, Gentleman Scientist, pp. 1-12. http://www.lithoguru.com/scientist/lithobasics.html, Jan. 2006.

Allen, et al., "Signal Path of a Multiple-Patterned Semiconductor Device", filed Jan. 2, 2013. Application No. 13732525.

* cited by examiner

411 First Mask

422 Second Mask

403 Photoresist Layer Preexposure

402 Interlayer Insulating Film Layer

401 Semiconductor Substrate Layer

SIGNAL PATH AND METHOD OF MANUFACTURING A MULTIPLE-PATTERNED SEMICONDUCTOR DEVICE

CROSS-REFERENCE TO RELATED APPLICATIONS

This application is a continuation of co-pending U.S. patent application Ser. No. 13/732,721, filed Jan. 2, 2013. The aforementioned related patent application is herein incorporated by reference in its entirety.

TECHNICAL FIELD

This disclosure relates generally to a semiconductor device and method of manufacture and, more particularly, relates to a multiple-patterned semiconductor device.

BACKGROUND

The semiconductor industry is producing more and more capable components with smaller and smaller feature sizes. Due to the increased demand for highly integrated semiconductor devices, advanced techniques of fabricating more semiconductor devices in a smaller die area have become strongly relied upon. The production of such semiconductor devices reveals new design and manufacturing challenges to be addressed in order to maintain or improve semiconductor device performance.

As the device density of semiconductors increases, the conductor line width and spacing within the semiconductor devices decreases. Multiple-pattern lithography represents a class of technologies developed for photolithography to enhance the feature density of semiconductor devices. Double-patterning, a subset of multiple-patterning, may be used as early as the 45 nm node in the semiconductor industry and may be the primary technique for the 32 nm node and beyond. Double-patterning employs multiple masks and photolithographic steps to create a particular level of a semiconductor device. With benefits such as tighter pitches and narrower wires, double-patterning alters relationships between variables related to semiconductor device wiring and wire quality to sustain performance.

SUMMARY

In an embodiment, this disclosure relates to a multiple-patterned semiconductor device. The semiconductor device may include one or more layers. A particular level of the semiconductor device may include signal tracks defined by different masks and exposures. The signal tracks may have a quality characteristic. The semiconductor device may include repeater banks. The repeater banks may repower signals. The semiconductor device may achieve a timing tolerance standard.

In an embodiment, this disclosure relates to a method of manufacture for a multiple-patterned semiconductor device. The method of manufacture includes defining portions of layers. Photomasks having signal track patterns may be used to define the portions of the layers. The method may include determining a quality characteristic of the signal track patterns. The method may include selecting a photomask for etching vias. The method may achieve a signal travel path within a timing tolerance standard.

DETAILED DESCRIPTION

Figure 1A:
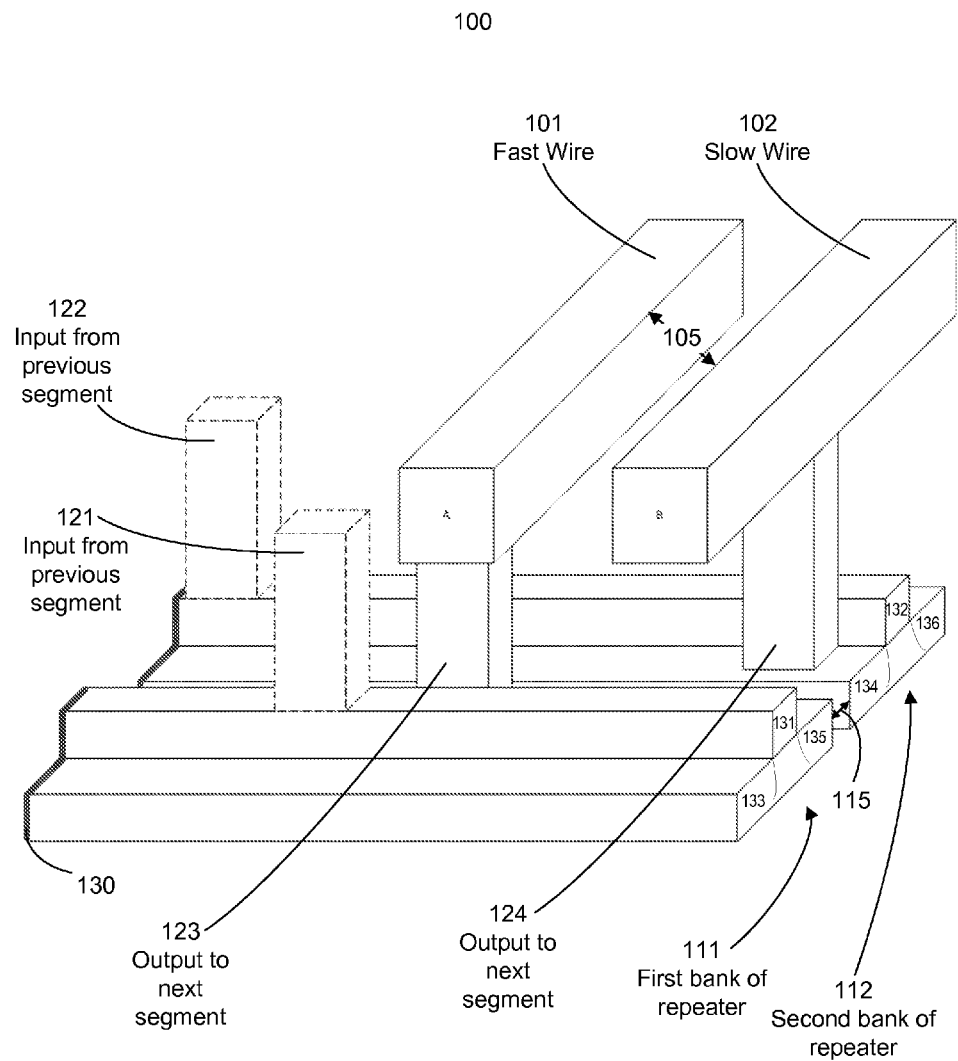
FIG. 1A is a perspective view showing double-patterned signal tracks carrying wires, connectors, and repeater banks pursuant to the disclosure.

As conductor line width and pitch geometries decrease, the use of double-patterning on a particular level may increase in order to achieve the required conductor dimensions while still using existing state of the art lithographic exposure equipment. A benefit of double-patterning includes the ability to form tight conductor pitches; however, double-patterning may introduce other variables related to timing and noise into the semiconductor process. Double-patterns alter relationships between adjacent wires in both width and spacing. Adjacent wire channels may be defined in separate lithography steps. Distinctions between adjacent wires may arise due to lithographic exposure variations and registration or placement errors of one exposure relative to another. The need to design for non-optimal wires restricts semiconductor design variables, such as signal repeater spacing, which may affect semiconductor die size.

Single level patterning enables straightforward characterization of parameters with signal delay implications such as wire width, height, and spacing variations. A product of a resistance value (R) of a wire and a capacitance value (C) of the wire forms an RC time constant for the wire (note this is an approximation since the R and the C are distributed along the wire length). Historically, a decrease in wire width or thickness brings about a resistance increase and a corresponding capacitance decrease. The C decrease approximately offsets the R increase in the RC time constant. Such capacitance decrease occurs in part due to a reduction in lateral capacitance because the space between wires increases as wire width decreases. Similarly, an increase in wire width or thickness brings about a resistance decrease approximately offset in the RC time constant by a corresponding capacitance increase. Such a capacitance increase occurs in part due to a rise in lateral capacitance because the space between wires decreases as wire width increases. Thus, in conventional, single-patterned wires the RC time constant remains within appropriate limits of tolerance.

Double-patterning prompts a different nature of lateral capacitance relative to single level patterning. In double-patterning, the width of adjacent wires is rather independent, i.e., track poorly. Wire widths may not track well between adjacent wires created using separate exposures. Relatively narrow wires may be next to or between relatively wide wires. Double-patterning creates varying lateral capacitance between adjacent wires effectively separate from wire resistance variations. The resistance value (R) and the capacitance value (C) may fail to counterbalance each other across process variations. For example, a highly resistive wire may have high R and high C. Thus, the RC time constant between adjacent wires may vary significantly. Wires of one pattern of a double-pattern may carry a signal faster than wires of the other pattern. This may cause signals to reach their respective destinations at different times. Early analysis of a particular 14-15 nm technology indicates a potential doubling of worst case lateral capacitance between adjacent wires, doubling of coupled noise, and increased total wire C by as much as 50%. Such variations may require a solution to mitigate these effects. Potential solutions include repeaters more frequently placed or wires separated more. Such solutions may increase semiconductor die size. Increasing semiconductor die size may be discouraged and may negatively impact the ability to use such a semiconductor device in some systems. Using signal tracks from more than one pattern to carry a signal may achieve desirable results related to signal timing.

Given significant variations in a wire RC time constant, designing for a high RC time constant on both "A wires" and "B wires" may involve close signal repeater spacing. As only either the "A wires" or the "B wires" may be at the RC time constant limit of tolerance, mitigating the one of a higher RC time constant by reducing signal repeater spacing may suffice. This may reduce the excess margin required for spacing all signal repeaters at the high RC time constant wire driven limit. As the logic content of a die increases, on-chip communication requirements tend to grow exponentially in both the width of buses between die elements and the speed at which the buses must run. Reducing signal repeater spacing impacts designs by limiting the maximum sized unit that can be placed between repeater bays, which may complicate large block timing closure and increase die size. Maximizing signal repeater spacing may benefit semiconductor die size.

A semiconductor device may include a layer which may conduct a signal. Such a signal conductor layer may be multiple-patterned. In an embodiment, the layer may be double-patterned. Photolithography steps may involve separate masks including a first mask and a second mask. Adjacent wire channels may be defined with such separate masks in separate lithography steps. A first pattern with a wire channel may carry an "A wire" and a second pattern with a wire channel may carry a "B wire." Wiring channels may alternate in layout for "A wires" and "B wires." Thus, an "A wire" may exist between "B wires" and a "B wire" may exist between "A wires."

A repeater may transfer a signal from a first signal track to a second signal track. As such, the repeater may transfer the signal from an "A wire" to a "B wire" or from a "B wire" to an "A wire." The signal may be transferred multiple times in traveling from an origin to a destination. Signal paths may carry signals in part on fast wires and in part on slow wires. Signal paths may be transferred using vias and a higher level metal. Signal paths may criss-cross. Other possibilities for transferring signals are considered.

The repeater may repower the signal. The signal may be repowered multiple times in traveling from the origin to the destination. Two signals traveling from origins on "A wires" and "B wires" may each reach destinations to achieve a timing tolerance standard. The timing tolerance standard may include a difference from an amount of time for a first signal path and a second signal path to carry a signal a distance from the origin to the destination. The amount of time may be the expected time for the signal path to carry the signal the distance. The difference may be statistical or deterministic. The difference may be statistical when a signal path carries a signal on an equal number of "A wires" and "B wires." The difference may be deterministic when a signal path carries a signal on an unequal number of "A wires" and "B wires," such as embodiments where a signal path carries a signal on one more "A wire" or on one more "B wire." In embodiments, at least one signal path may transfer or criss-cross without repowering. Other expected times and differences are considered.

Advanced semiconductor process technologies may utilize a dual damascene technique. With this technique, a metal trace may be defined before an underlying via to an underlying plane. The signal tracks may have a quality characteristic. Examples of the quality characteristic may be a size value, a width, an RC time constant value, or a time for a signal to travel a distance. A first quality characteristic may be considered substantially equal to a second quality characteristic if the values are within five percent of one another.

The width of the metal troughs for "A wires" and "B wires" may be measured. The width of the metal trough for an "A wire" may be the first quality characteristic and the width of the metal trough for a "B wire" may be the second quality characteristic. The measurement may occur before etching the metal troughs. The measurement may occur before etching the underlying vias. The connections below said metal wire may be modified by selecting one of various via level design reticles. Allowing a potential via in either of two or more locations that could connect to either of two or more potential signal repeaters may mitigate the effects of the high RC time constant, slower wire. In this case, the slower wire drives more closely spaced repeaters.

FIG. 1A is a perspective view showing double-patterned signal tracks carrying wires, connectors, and repeater banks pursuant to the disclosure. Illustration 100 depicts a semiconductor device according to an embodiment. In FIG. 1A, for example, signal tracks carrying "A wires" 101 (shown relatively wide) may be faster than signal tracks carrying "B wires" 102 (shown relatively narrow). The "A wires" 101 may have a shorter RC time constant than the "B wires" 102. A signal track carrying an "A wire" 101 and signal track carrying a "B wire" 102 may be distanced by a signal track separation space 105.

A repeater may exist with multiple repeater banks. A repeater bank may be synonymous with a repowering block. Each repeater bank may have a measurable area, FET width, transistor threshold voltage, and buffer strength. A first repeater bank 111 and a second repeater bank 112 may be distanced by a repeater bank separation space 115. The repeater banks may each have an insulation 130, a gate 131 or 132, and source-drain areas 133, 135 or 134, 136. In an embodiment, the first repeater bank 111 and the second repeater bank 112 may have equivalent areas, FET widths, transistor threshold voltages, and buffer strengths.

Vias may serve to connect wires and repeater banks. A first via input 121 may exist to join a previous wire segment to the first repeater bank 111. A second via input 122 may exist to join a previous wire segment to the second repeater bank 112. A first via output 123 may exist to join the first repeater bank 111 to a next wire segment. A second via output 124 may exist to join the second repeater bank 112 to a next wire segment. In an embodiment, the inputs 121, 122 and the outputs 123, 124 of the repeater banks 111, 112 may be alternated by one signal track. In other embodiments, inputs such as 121, 122 and outputs such as 123, 124 may be arranged an odd number of signal tracks apart. Other possibilities are considered with other embodiments.

Figure 1B:
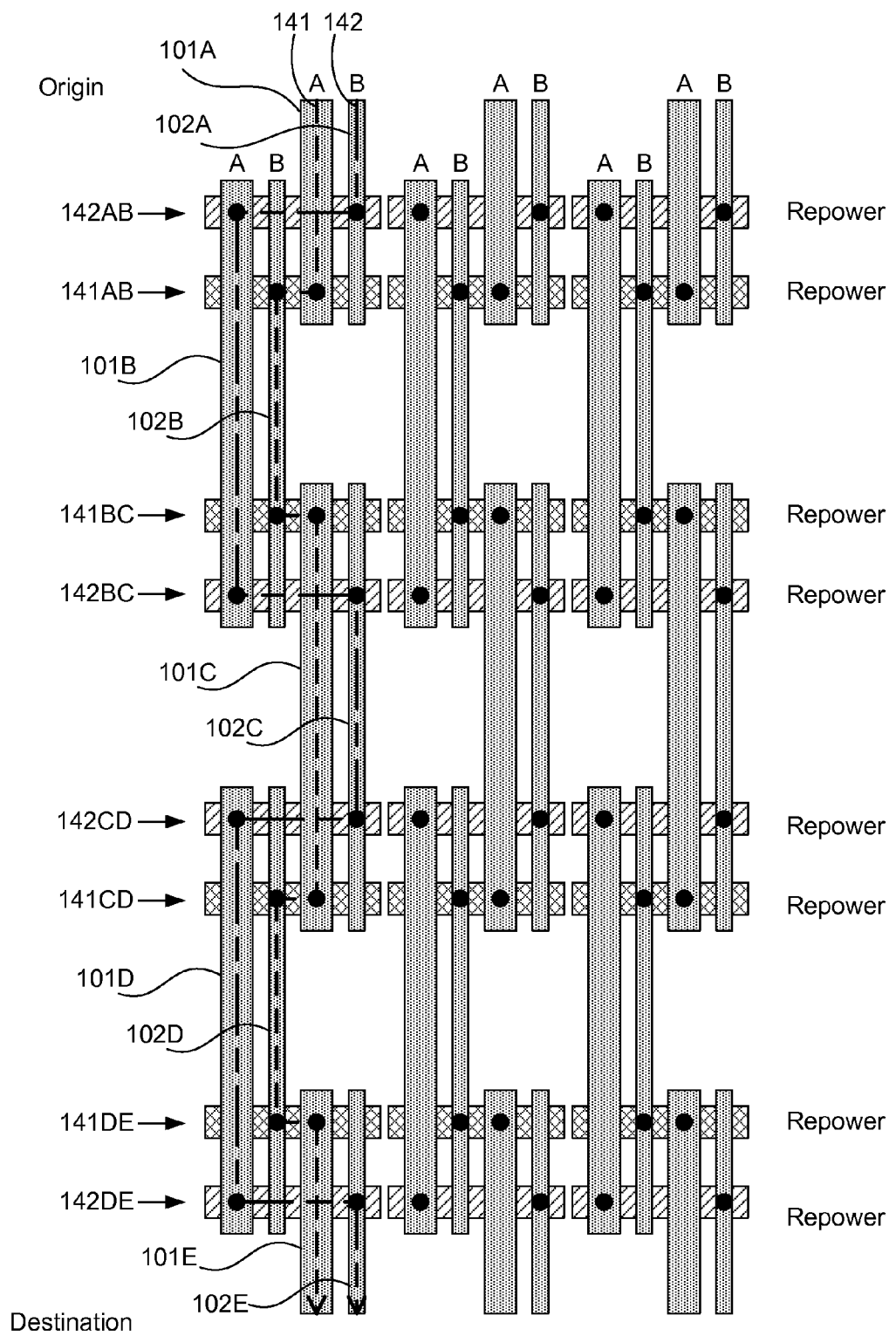
FIG. 1B is a planar view showing both an example signal path on wires that a signal may travel on double-patterned signal tracks and the relative location of repeater banks according to an embodiment of the disclosure.

FIG. 1B is a planar view showing both an example signal path on wires that a signal may travel on double-patterned signal tracks and the relative location of repeater banks according to an embodiment of the disclosure. In FIG. 1B, for example, signal tracks carrying "A wires" 101 may be faster than signal tracks carrying "B wires" 102. The "A wires" 101 may have a shorter RC time constant than the "B wires" 102. The wires may be in segments shown in FIG. 1B as 101A, 101B, 101C, 101D, 101E for "A wires" and 102A, 102B, 102C, 102D, 102E for "B wires."

A signal track carrying a wire may have a signal path transferred to another signal track carrying a wire at each repeater bank. In an embodiment, the signal path may be alternated by one signal track. The signal path may alternate between "A wires" 101 and "B wires" 102, transferring at repeater banks. In other embodiments, the signal path on "A wires" 101 and "B wires" 102 may be staggered in different ways such as an arrangement where signal paths include signal tracks where the transfer of a signal is to a signal track an odd number away. As in FIG. 1B, the effect is that signal paths carrying signals may weave back and forth between "A wires" 101 and "B wires" 102, repowering at repeater banks along the way.

As depicted in FIG. 1B, the signal path of example signal 141 may originate on an "A wire" 101A, transfer using repeater bank 141AB to a "B wire" 102B, transfer using repeater bank 141BC to an "A wire" 101C, transfer using repeater bank 141CD to a "B wire" 102D, and transfer using repeater bank 141DE to an "A wire" 101E where signal 141 ultimately reaches its destination. Similarly, the signal path of example signal 142 may originate on a "B wire" 102A, transfer using repeater bank 142AB to an "A wire" 101B, transfer using repeater bank 142BC to a "B wire" 102C, transfer using repeater bank 142CD to an "A wire" 101D, and transfer using repeater bank 142DE to a "B wire" 102E where signal 142 ultimately reaches its destination.

Two signal paths, each carrying a signal, traveling on an equal number of "A wires" 101 and "B wires" 102 may result in the signals traveling the same distance in a nearly equivalent amount of time as each other. A signal traversing in an alternating fashion between "A wires" 101 and "B wires" 102 may arrive at the destination at a time nearly equivalent to a signal traversing in an alternating fashion between "B wires" 102 and "A wires" 101. As in illustration 140, signals 141 and 142 will reach their destinations at nearly the same time, having traveled on fast wires 101 and slow wires 102 the same distances (plus or minus the length of one wire segment). Such signal travel may occur without excessively stressing a high RC wire.

Figure 1C:
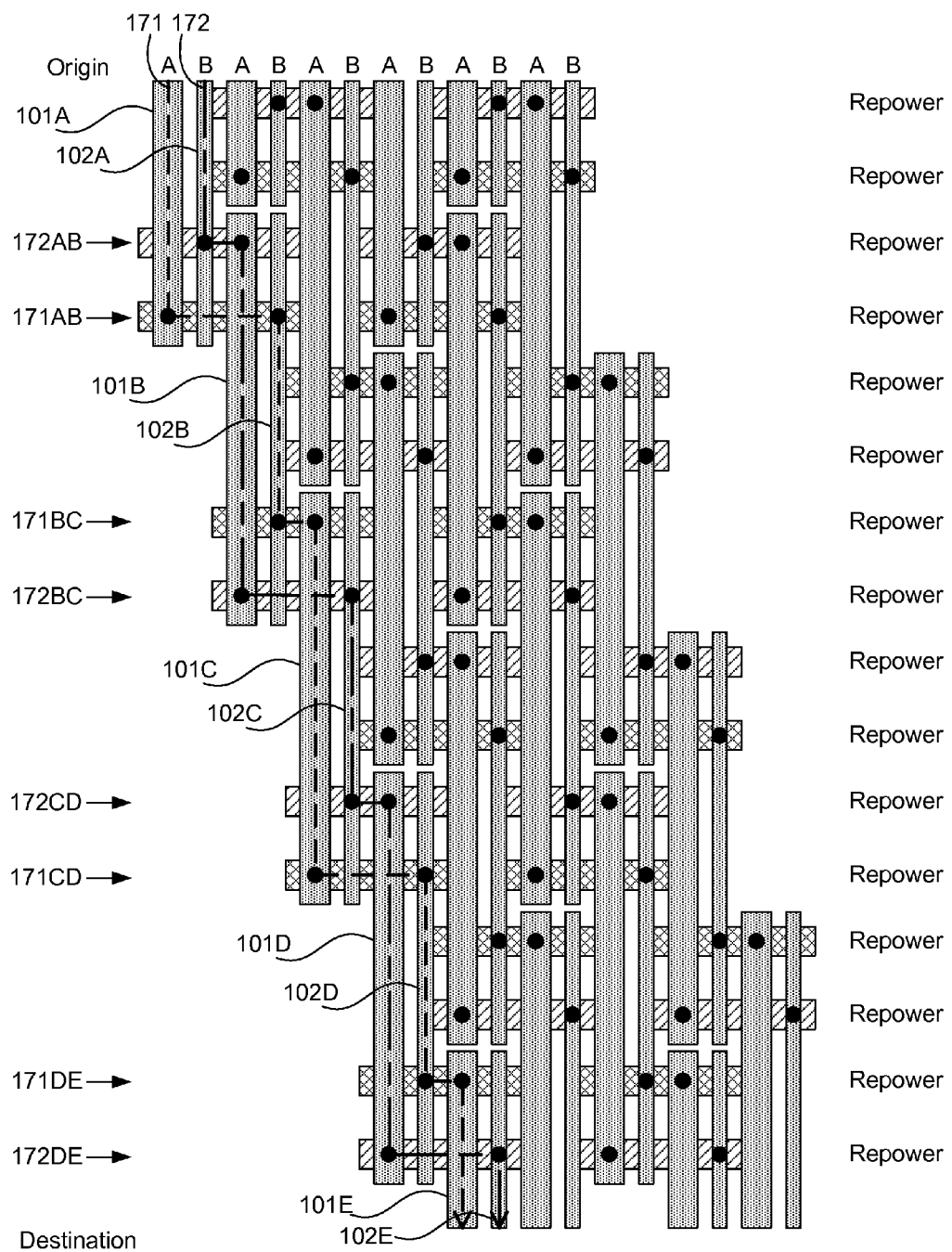
FIG. 1C is a planar view showing both an example signal path on wires that a signal may travel on double-patterned signal tracks and the relative location of repeater banks according to an embodiment of the disclosure.

FIG. 1C is a planar view showing both an example signal path on wires that a signal may travel on double-patterned signal tracks and the relative location of repeater banks according to an embodiment of the disclosure. In FIG. 1C, for example, signal tracks carrying "A wires" 101 may be faster than signal tracks carrying "B wires" 102. The "A wires" 101 may have a shorter RC time constant than the "B wires" 102. The wires may be in segments shown in illustration 170 as 101A, 101B, 101C, 101D, 101E for "A wires" and 102A, 102B, 102C, 102D, 102E for "B wires."

A signal track carrying a wire may have a signal path transferred to another signal track carrying a wire at each repeater bank. In an embodiment, the signal path may be alternated by one signal track. The signal path may alternate between "A wires" 101 and "B wires" 102, transferring at repeater banks. In other embodiments, the signal path on "A wires" 101 and "B wires" 102 may be staggered in different ways such as an arrangement where signal paths include signal tracks where the transfer of a signal is to a signal track an odd number away. As in FIG. 1C, the effect is that signal paths carrying signals may weave back and forth between "A wires" 101 and "B wires" 102, repowering at repeater banks along the way.

As depicted in FIG. 1C, the signal path of example signal 171 may originate on an "A wire" 101A, transfer using repeater bank 171AB to a "B wire" 102B, transfer using repeater bank 171BC to an "A wire" 101C, transfer using repeater bank 171CD to a "B wire" 102D, and transfer using repeater bank 171DE to an "A wire" 101E where signal 171 ultimately reaches its destination. Similarly, the signal path of example signal 172 may originate on a "B wire" 102A, transfer using repeater bank 172AB to an "A wire" 101B, transfer using repeater bank 172BC to a "B wire" 102C, transfer using repeater bank 172CD to an "A wire" 101D, and transfer using repeater bank 172DE to a "B wire" 102E where signal 172 ultimately reaches its destination.

Two signal paths, each carrying a signal, traveling on an equal number of "A wires" 101 and "B wires" 102 may result in the signals traveling the same distance in a nearly equivalent amount of time as each other. A signal traversing in an alternating fashion between "A wires" 101 and "B wires" 102 may arrive at the destination at a time nearly equivalent to a signal traversing in an alternating fashion between "B wires" 102 and "A wires" 101. As in FIG. 1C, signals 171 and 172 will reach their destinations at nearly the same time, having traveled on fast wires 101 and slow wires 102 the same distances (plus or minus the length of one wire segment). Such signal travel may occur without excessively stressing a high RC wire.

The magnitude of the RC time constant may correlate to the magnitude of delay with a changing wire length. Signal delay on a signal path may correlate to the square of the wire length needed for the signal to traverse a distance. Reducing repeater spacing may reduce the wire component of the RC time constant by the square of the ratio of the reduced repeater spacing and the original repeater spacing. The wire may extend the distance of the original repeater spacing. The capacitance component may fail to experience a reduction. Allowing the higher RC wires to be more closely spaced than the better quality wires nets a larger average spacing between repeaters. As discussed above, a larger average spacing between repeaters may benefit the die size and permit more design variables. Such spacing may positively impact the semiconductor device as a whole.

Figure 2:
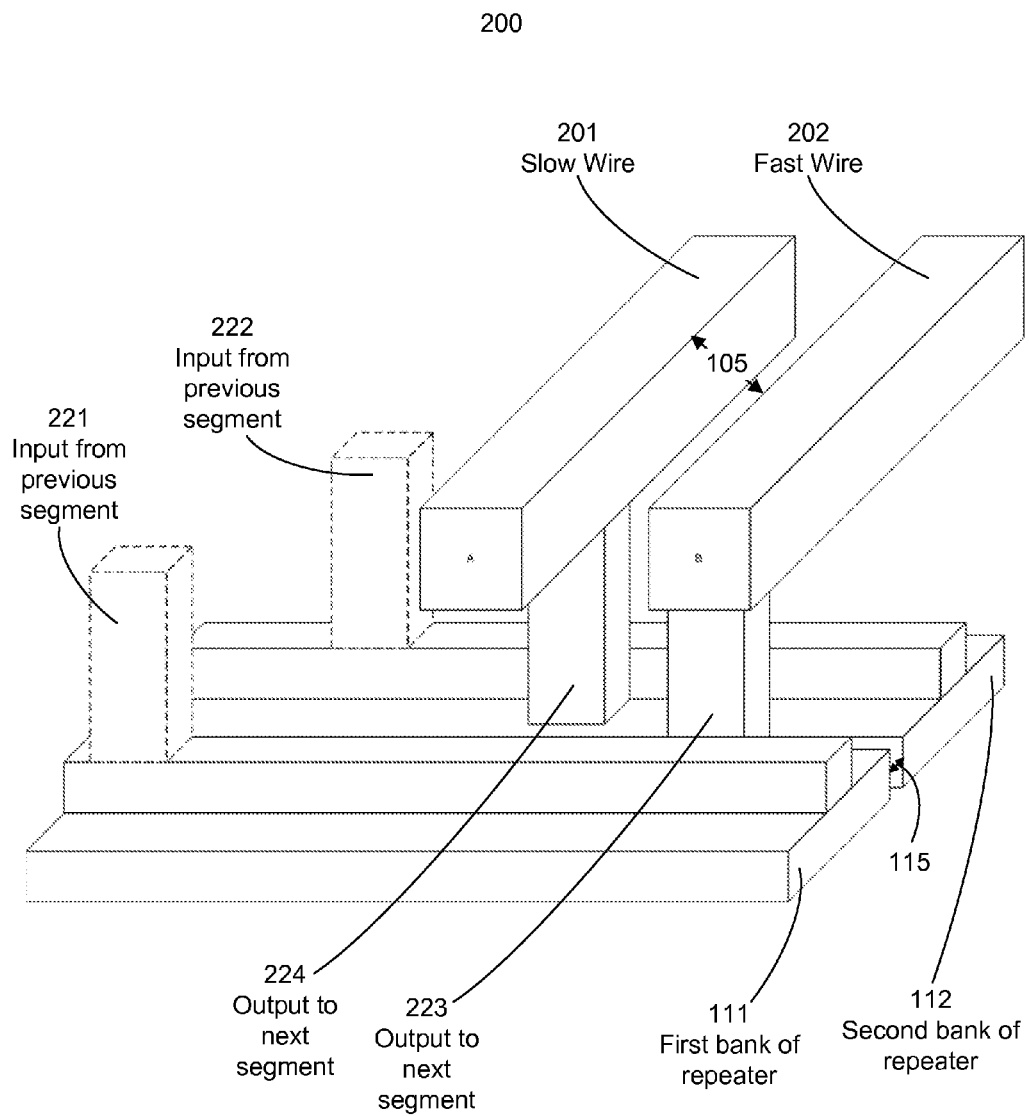
FIG. 2 is a perspective view showing double-patterned signal tracks carrying wires, connectors, and repeater banks pursuant to the disclosure.

FIG. 2 is a perspective view showing double-patterned signal tracks carrying wires, connectors, and repeater banks pursuant to the disclosure. Illustration 200 depicts a semiconductor device according to an embodiment. Aspects of the embodiment depicted in FIG. 2 are similar or the same as depicted in illustration 100. In illustration 200, for example, signal tracks carrying "B wires" 202 may be faster than signal tracks carrying "A wires" 201. The "B wires" 202 may have a shorter RC time constant than the "A wires" 201.

Vias may serve to connect wires and repeater banks. A first via input 221 may exist to join a previous wire segment to the first repeater bank 111. A second via input 222 may exist to join a previous wire segment to the second repeater bank 112. A first via output 223 may exist to join the first repeater bank 111 to a next wire segment. A second via output 224 may exist to join the second repeater bank 112 to a next wire segment. In an embodiment, the inputs 221, 222 and the outputs 223, 224 of the repeater banks 111, 112 may be alternated by one signal track. In other embodiments, inputs such as 221, 222 and outputs such as 223, 224 may be arranged an odd number of signal tracks apart. Other possibilities are considered with other embodiments.

Figure 3:
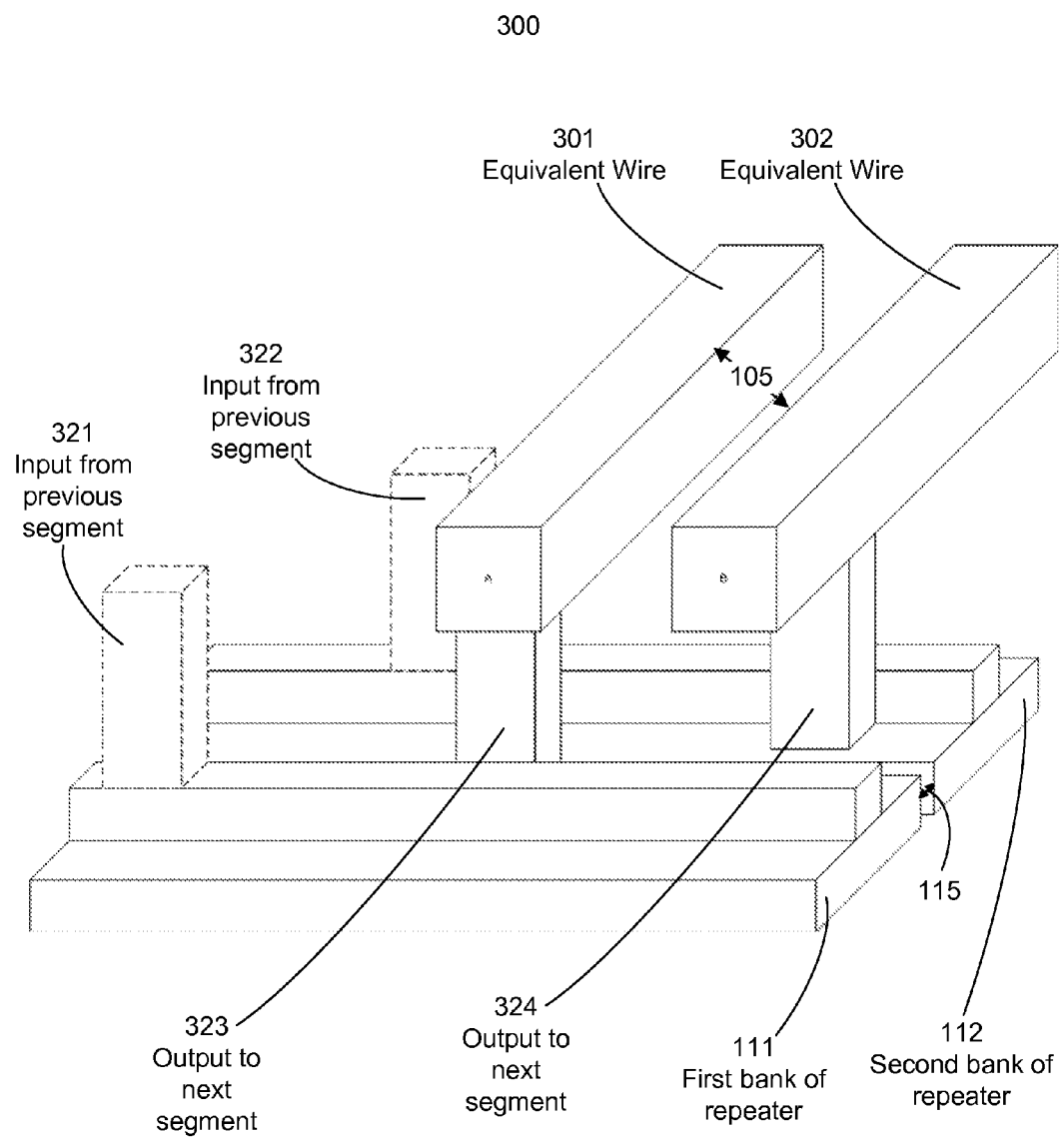
FIG. 3 is a perspective view showing double-patterned signal tracks carrying wires, connectors, and repeater banks pursuant to the disclosure.

FIG. 3 is a perspective view showing double-patterned signal tracks carrying wires, connectors, and repeater banks pursuant to the disclosure. Illustration 300 depicts a semiconductor device according to an embodiment. Aspects of the embodiment depicted in illustration 300 may be similar or the same as depicted in illustrations 100, 200. In illustration 300, for example, signal tracks carrying "A wires" 301 may be equivalent in speed to signal tracks carrying "B wires" 302. The "A wires" 301 may be equivalent in RC to the "B wires" 302.

Vias may serve to connect wires and repeater banks. A first via input 321 may exist to join a previous wire segment to the first repeater bank 111. A second via input 322 may exist to join a previous wire segment to the second repeater bank 112. A first via output 323 may exist to join the first repeater bank 111 to a next wire segment. A second via output 324 may exist to join the second repeater bank 112 to a next wire segment. In an embodiment, the inputs 321, 322 and the outputs 323, 324 of the repeater banks 111, 112 may be alternated by one signal track. In other embodiments, inputs such as 321, 322 and outputs such as 323, 324 may be arranged an odd number of signal tracks apart. If the wires are equivalent in RC, illustrations such as 100, 200 may also succeed and the connections may be discretionary. Other possibilities are considered with other embodiments.

Connections may be made at a different pattern design levels or layers according to embodiments. Transfer of signals may occur between multiple layers. Repowering may occur in this context as well. A signal may transfer from a signal track on a first signal conductor layer to a signal track on a second signal conductor layer using vias and higher level metals or other techniques. The transfer may occur in a similar fashion as shown in illustrations 100, 140, 170, 200, 300. As such, the signal may be transferred multiple times in traveling from an origin to a destination. Such back and forth between signal tracks carrying slow wires and fast wires may occur across the semiconductor device between multiple layers. Other configurations and possibilities are considered with other embodiments.

Figure 4A:
FIG. 4A is a cross-sectional view of a semiconductor device pre-exposure to a first mask and pre-exposure to a second mask pursuant to the disclosure.
Figure 4A:
Figure 4A:
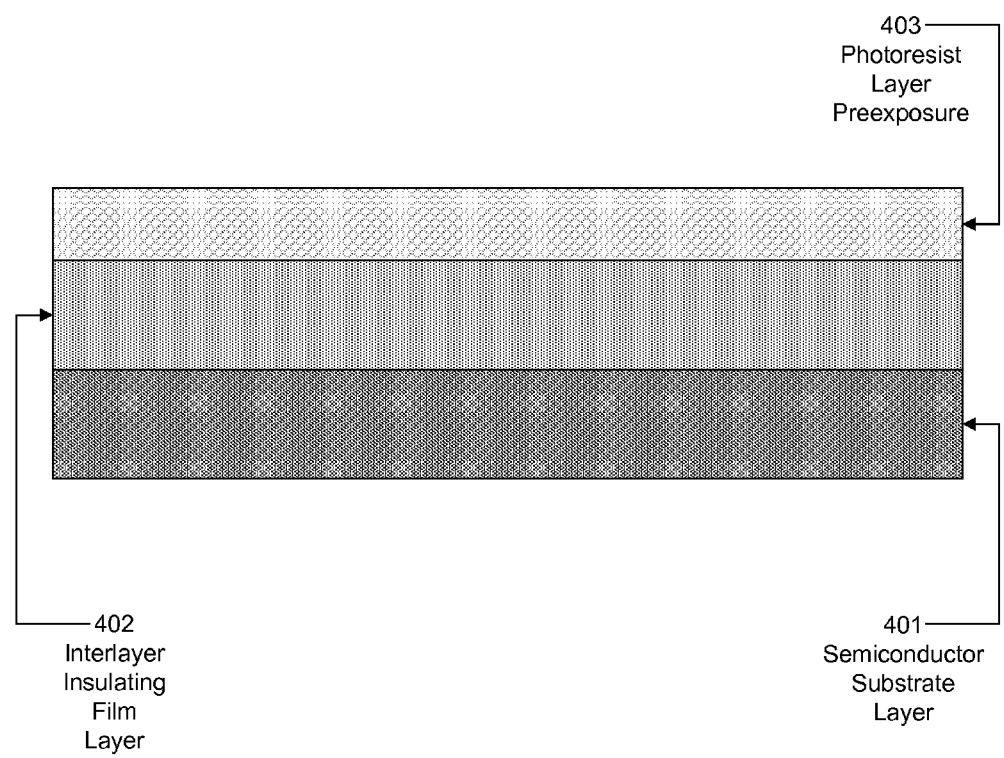

FIG. 4A is a cross-sectional view of a semiconductor device pre-exposure to a first mask and pre-exposure to a second mask pursuant to the disclosure. To form a semiconductor device, an interlayer insulating film 402 may be formed on a semiconductor substrate 401 in which various components are to be formed. A photoresist 403 may then be coated on the interlayer insulating film 402. Advanced semiconductor process technologies may utilize a dual damascene technique. With this technique, the metal trace may be defined before the underlying via to the underlying plane. A first mask 411 may be used to define a first signal track set and a second mask 422 may be used to define a second signal track set.

Figure 4B:
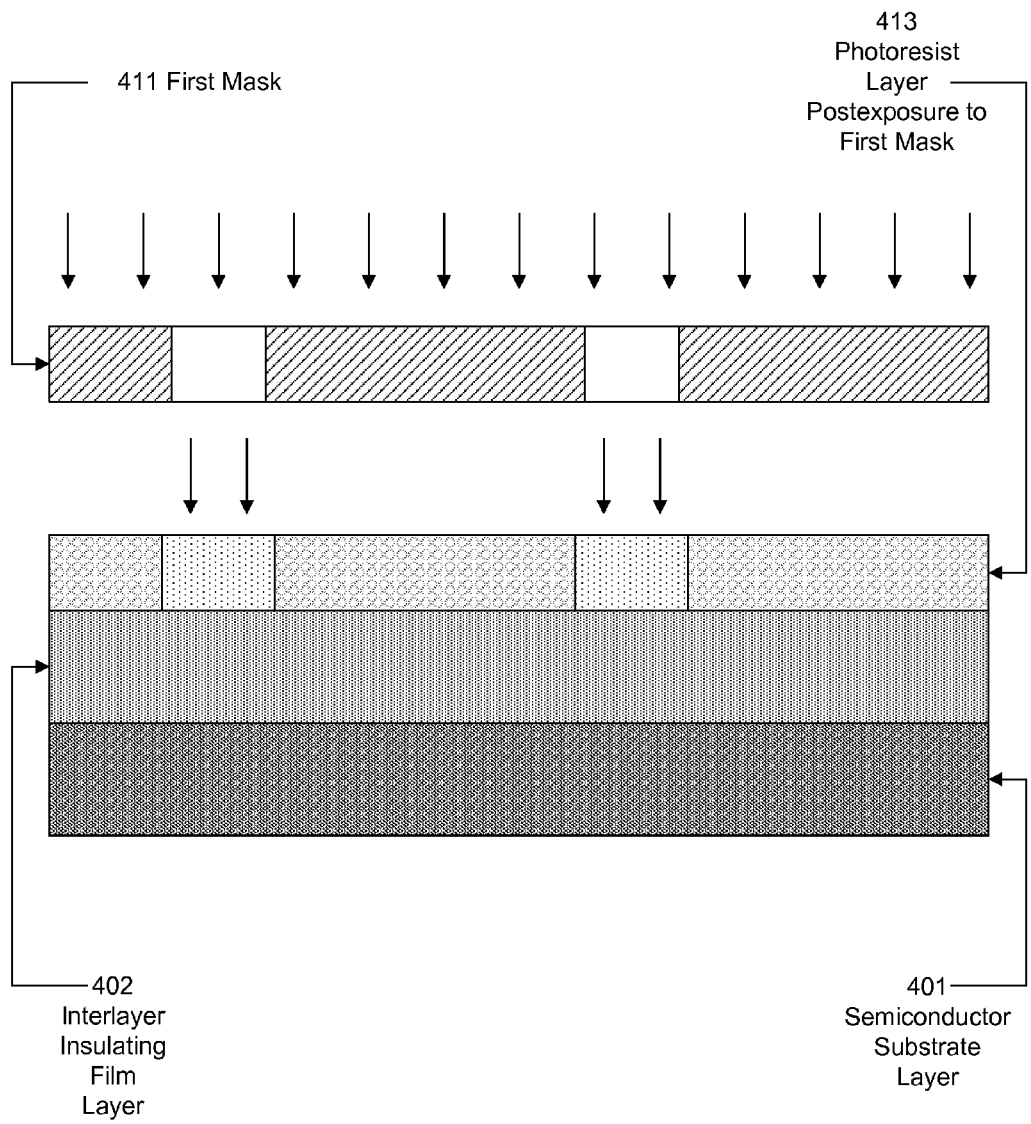
FIG. 4B is a cross-sectional view of a semiconductor device post-exposure to the first mask and pre-exposure to the second mask pursuant to the disclosure.

FIG. 4B is a cross-sectional view of a semiconductor device post-exposure to the first mask and pre-exposure to the second mask pursuant to the disclosure. The first mask 411 may define the first signal track set on the photoresist 403 through exposure. A photoresist 413 post-exposure to the first mask may have the first signal track set defined.

Figure 4C:
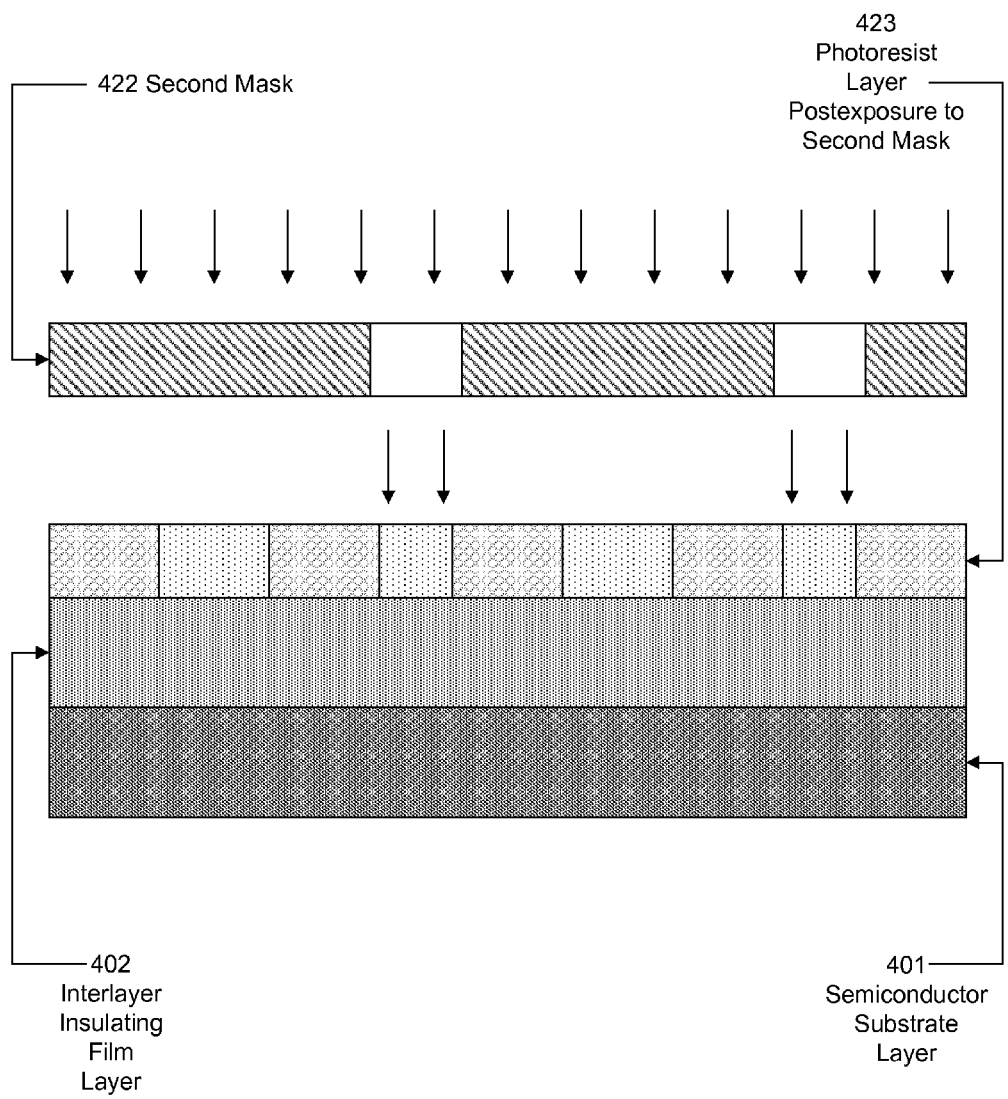
FIG. 4C is a cross-sectional view of a semiconductor device post-exposure to both the first mask and to the second mask pursuant to the disclosure.

FIG. 4C is a cross-sectional view of a semiconductor device post-exposure to both the first mask and to the second mask pursuant to the disclosure. The second mask 422 may define the second signal track set on the photoresist 413 through exposure. A photoresist 423 post-exposure to the second mask may have the second signal track set defined.

Figure 4D:
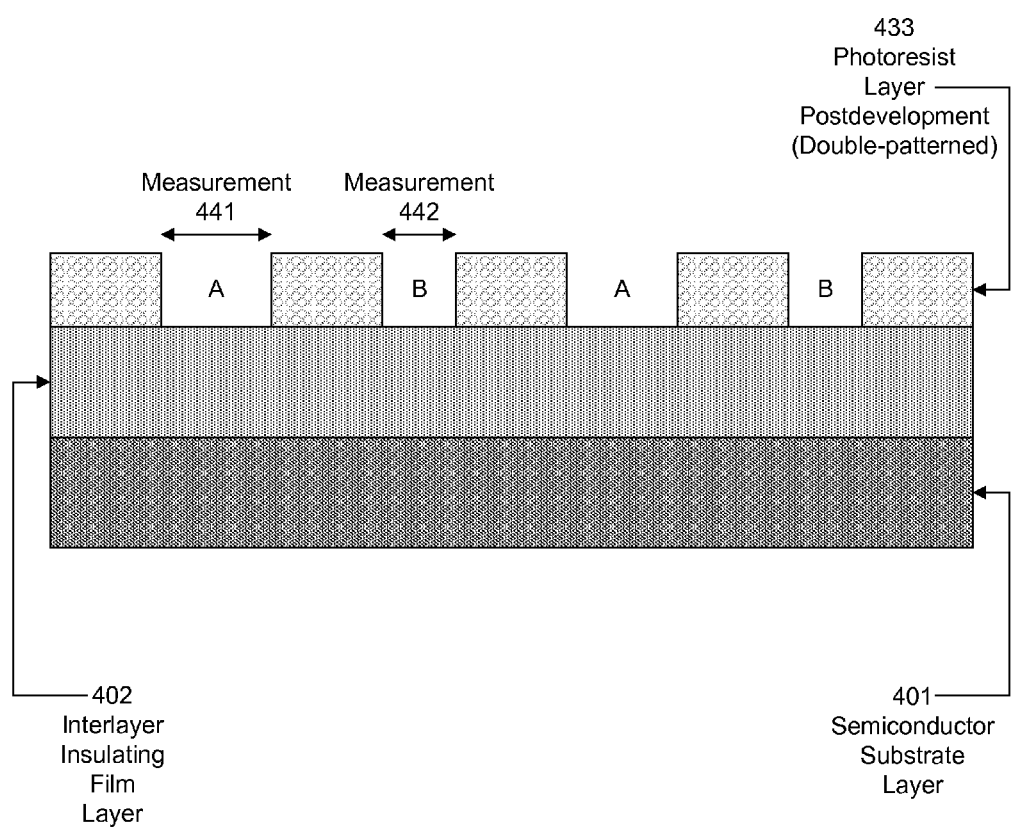
FIG. 4D is a cross-sectional view of a semiconductor device post-development pursuant to the disclosure.

FIG. 4D is a cross-sectional view of a semiconductor device post-development pursuant to the disclosure. A photoresist 433 post-development may have both the first signal track set and the second signal track set ready to be measured. The width of the metal troughs for "A wires" and "B wires" may be measured on the photoresist 433. The measurement may occur after the photoresist has been developed and processed. Processing may include removing portions of the photoresist that were exposed. The measurement may occur before etching the metal troughs. The measurement may occur before etching the underlying vias. Via locations may be decided before etching. The dominant variable of the variation in trough width may be due to the exposure. In FIG. 4D, for example, channels developed for "A wires" with a first width 441 may be faster than channels developed for "B wires" with a second width 442 because the first width 411 may be greater than the second width 412. In some embodiments, after etching the metal troughs, measurement may occur again before etching the underlying vias.

Figure 5A:
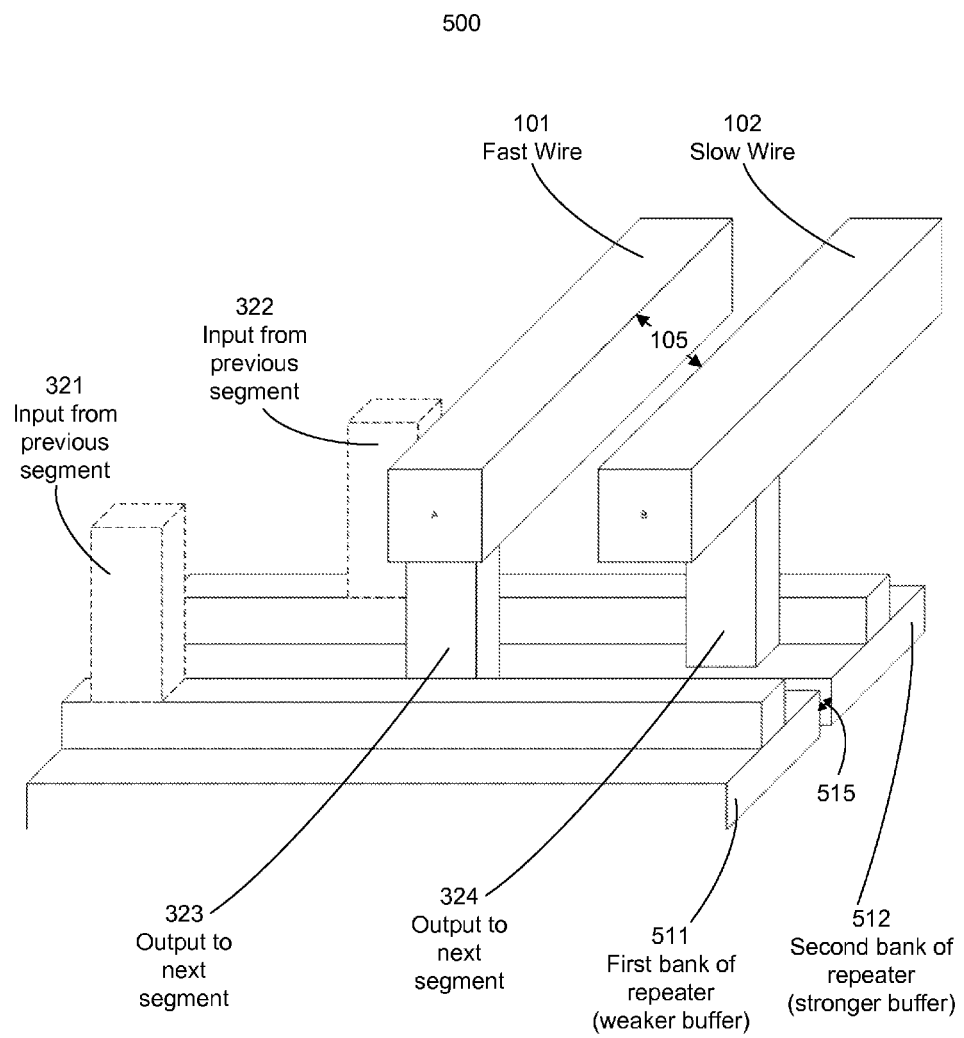
FIG. 5A is a perspective view showing double-patterned signal tracks carrying wires, connectors, and repeater banks pursuant to the disclosure.

FIG. 5A is a perspective view showing double-patterned signal tracks carrying wires, connectors, and repeater banks pursuant to the disclosure. Aspects of the semiconductor device depicted in illustration 500 may be similar or the same as depicted in illustrations 100, 140, 170, 200, 300, 400. In illustration 500, for example, signal tracks carrying "A wires" 101 may be faster than signal tracks carrying "B wires" 102. The "A wires" 101 may have a shorter RC time constant than the "B wires" 102. A first repeater bank 511 and a second repeater bank 512 may be distanced by a repeater bank separation space 515. The repeater bank separation space 515 may be as small as possible. For example, the repeater bank separation space 115 in illustrations 100, 140, 170, 200, 300, 400 may be 30 microns whereas the repeater bank separation space 515 in illustration 500 may be 1 micron.

A buffer strength may indicate the ability of a repeater to boost a signal over a distance from an origin to a destination. The buffer strength of a strong repeater bank may be fifty percent stronger than a weak repeater bank. In an embodiment, the first repeater bank 511 and the second repeater bank 512 may have different buffer strengths. A greater buffer strength may successfully drive a signal over a length of a particular wire in a specified time. In illustration 500, the buffer strength of the first repeater bank 511 connected to a signal track carrying a fast wire 101 may be weaker than the buffer strength of the second repeater bank 512 connected to a signal track carrying a slow wire 102.

In an embodiment, the different buffer strengths of the first repeater bank 511 and the second repeater bank 512 may result from making FET widths different or establishing different transistor threshold voltages for each repeater bank. The width of a repeater bank connected to a signal track with a slow wire may be larger relative to a FET width of a repeater bank connected to a signal track with a fast wire. A threshold voltage is the voltage at which there are sufficient electrons in to make a low resistance conducting path. Reducing a transistor threshold voltage of a repeater bank may increase the buffer strength of the bank. The transistor threshold voltage of a repeater bank connected to a signal track with a slow wire may be reduced relative to that of a repeater bank connected to a signal track with a fast wire. As depicted in illustration 500, repeater bank 512 may have a wider FET width or a reduced transistor threshold voltage relative to that of repeater bank 511. Thus, the buffer strength of the repeater bank 511 connected to a signal track with a fast wire 101 may be weaker than the buffer strength of the repeater bank 512 connected to a signal track with a slow wire 102.

In an embodiment, the different buffer strengths of the first repeater bank 511 and the second repeater bank 512 may result from establishing different areas for each repeater bank. The area may be directly proportional to a quantity of repeater finger connectors, hence affecting the buffer strength. Reducing the area of a repeater bank may decrease the buffer strength of the repeater bank. Enlarging the area of a repeater bank may increase the buffer strength of the repeater bank. Reducing the area of a first repeater bank may offset enlarging the area of second repeater bank. The total area of the two repeater banks as a whole may change insubstantially in modifying the area of each repeater bank individually. The area of the first repeater bank 511 connected to a signal track with a fast wire 101 may be reduced relative to that of the second repeater bank 512 connected to a signal track with a fast wire 102. In an embodiment, the first repeater bank 511 may have fewer repeater finger connectors than the second repeater bank 512. Thus, the buffer strength of the repeater bank 511 connected to a signal track with a fast wire 101 may be weaker than the buffer strength of the repeater bank 512 connected to a signal track with a slow wire 102.

Figure 5B:
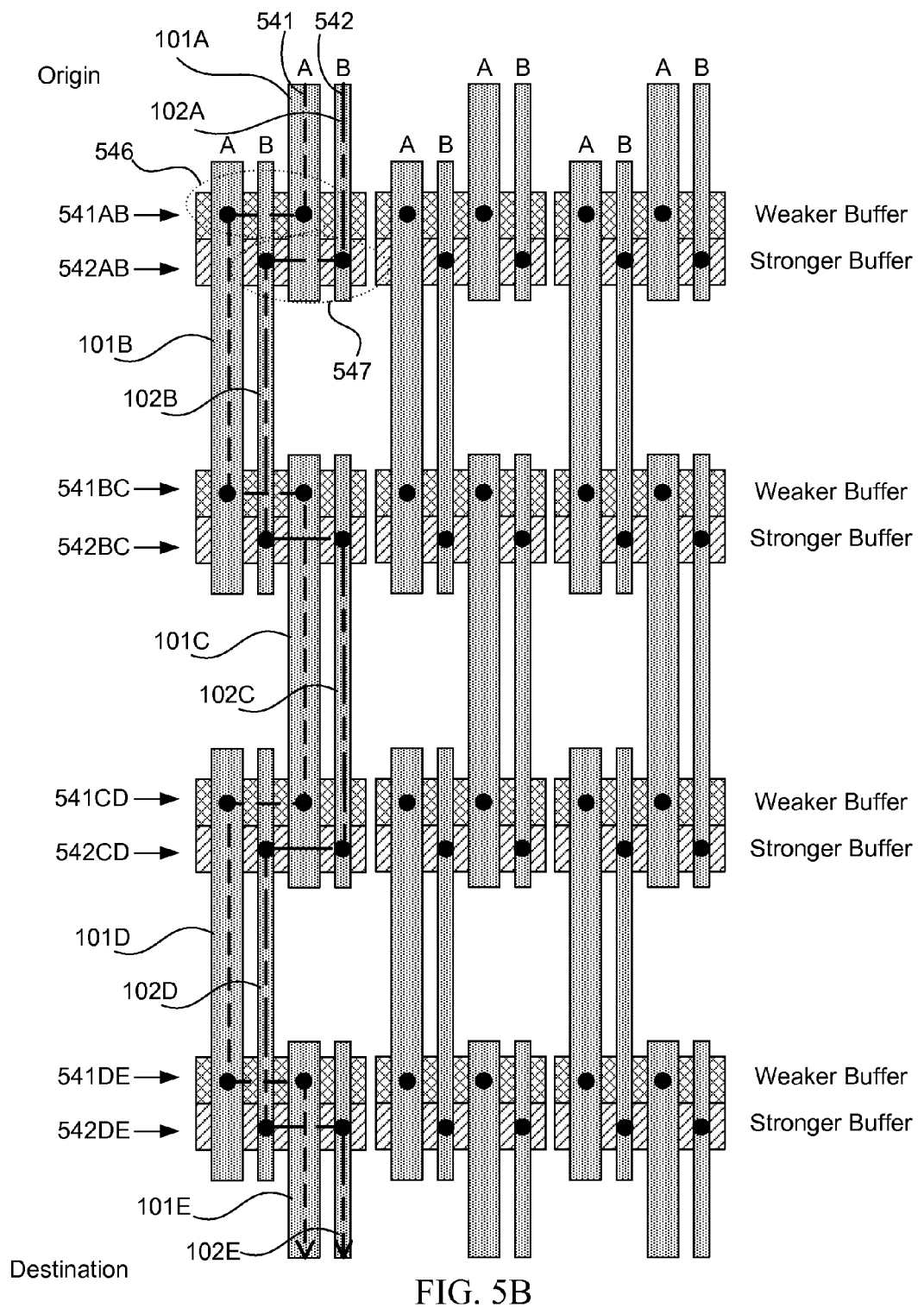
FIG. 5B is a planar view showing both an example signal path on wires that a signal may travel on double-patterned signal tracks and the relative location of repeater banks according to an embodiment of the disclosure.

FIG. 5B is a planar view showing both an example signal path on wires that a signal may travel on double-patterned signal tracks and the relative location of repeater banks according to an embodiment of the disclosure. Aspects of the semiconductor device depicted in FIG. 5B may be similar or the same as depicted in FIGS. 1A-5A. In FIG. 5B, for example, signal tracks carrying "A wires" 101 may be faster than signal tracks carrying "B wires" 102. The "A wires" 101 may have a shorter RC time constant than the "B wires" 102. The wires may be in segments shown in FIG. 5B as 101A, 101B, 101C, 101D, 101E for "A wires" and 102A, 102B, 102C, 102D, 102E for "B wires." The segment lengths may be of a substantially equal length. A substantially equal length may be a length of a first segment within ten percent of a length of a second segment. Selected vias 546 for a weaker repeater bank 541AB and selected vias 547 for a stronger repeater bank 542AB are shown in FIG. 5B. The vias 546, 547 may be chosen to connect signal tracks of a given RC time constant with repeater banks of a given strength. The needed strength or weakness selection and appropriate via connection may be done based on determination, by measurement, of trench widths. The trench will be filled with metal to make an "A wire" or a "B wire."

A signal track carrying a wire may have a signal path transferred to another signal track carrying a wire at each repeater bank. In an embodiment, the signal path may be alternated by two signal tracks. The signal path may alternate between different "A wires" 101 or different "B wires" 102, transferring at repeater banks. In other embodiments, the signal path on "A wires" 101 and "B wires" 102 may be staggered in different ways such as an arrangement where signal paths include signal tracks where the transfer of a signal is to a signal track an even number away. As in FIG. 5B, the effect is that signal paths carrying signals may weave back and forth between different "A wires" 101 or different "B wires" 102, repowering at repeater banks along the way.

In an embodiment, the repeater banks may have different buffer strengths. The different buffer strengths may result from establishing different FET widths or transistor threshold voltages for each repeater bank. FIG. 5B depicts signal 541 traveling on "A wires" and signal 542 traveling on "B wires." The signal may repower at repeater banks along the way. Repeater banks 541AB, 541BC, 541CD, and 541DE may be weaker repeater banks connected to signal tracks with fast wires 101 and repeater banks 542AB, 542BC, 542CD, and 542DE may be stronger repeater banks connected to signal tracks with slow wires 102. The FET widths of repeater banks connected to signal tracks with slow wires 102 may be larger relative to that of repeater banks connected to signal tracks with fast wires 101. Alternatively, the transistor threshold voltage of repeater banks connected to signal tracks with slow wires 102 may be reduced relative to that of repeater banks connected to signal tracks with fast wires 101. In such embodiment, a signal traveling on "A wires" 101 may arrive at the final destination at a time statistically equivalent to a signal traveling on "B wires" 102.

As depicted in FIG. 5B, the signal path of example signal 541 may originate on an "A wire" 101A, transfer using weaker repeater bank 541AB to an "A wire" 101B, transfer using weaker repeater bank 541BC to an "A wire" 101C, transfer using weaker repeater bank 541CD to an "A wire" 101D, and transfer using weaker repeater bank 541DE to an "A wire" 101E where signal 541 ultimately reaches its destination. Similarly, the signal path of example signal 542 may originate on a "B wire" 102A, transfer using stronger repeater bank 542AB to a "B wire" 102B, transfer using stronger repeater bank 542BC to a "B wire" 102C, transfer using stronger repeater bank 542CD to a "B wire" 102D, and transfer using stronger repeater bank 542DE to a "B wire" 102E where signal 542 ultimately reaches its destination.

Figure 5C:
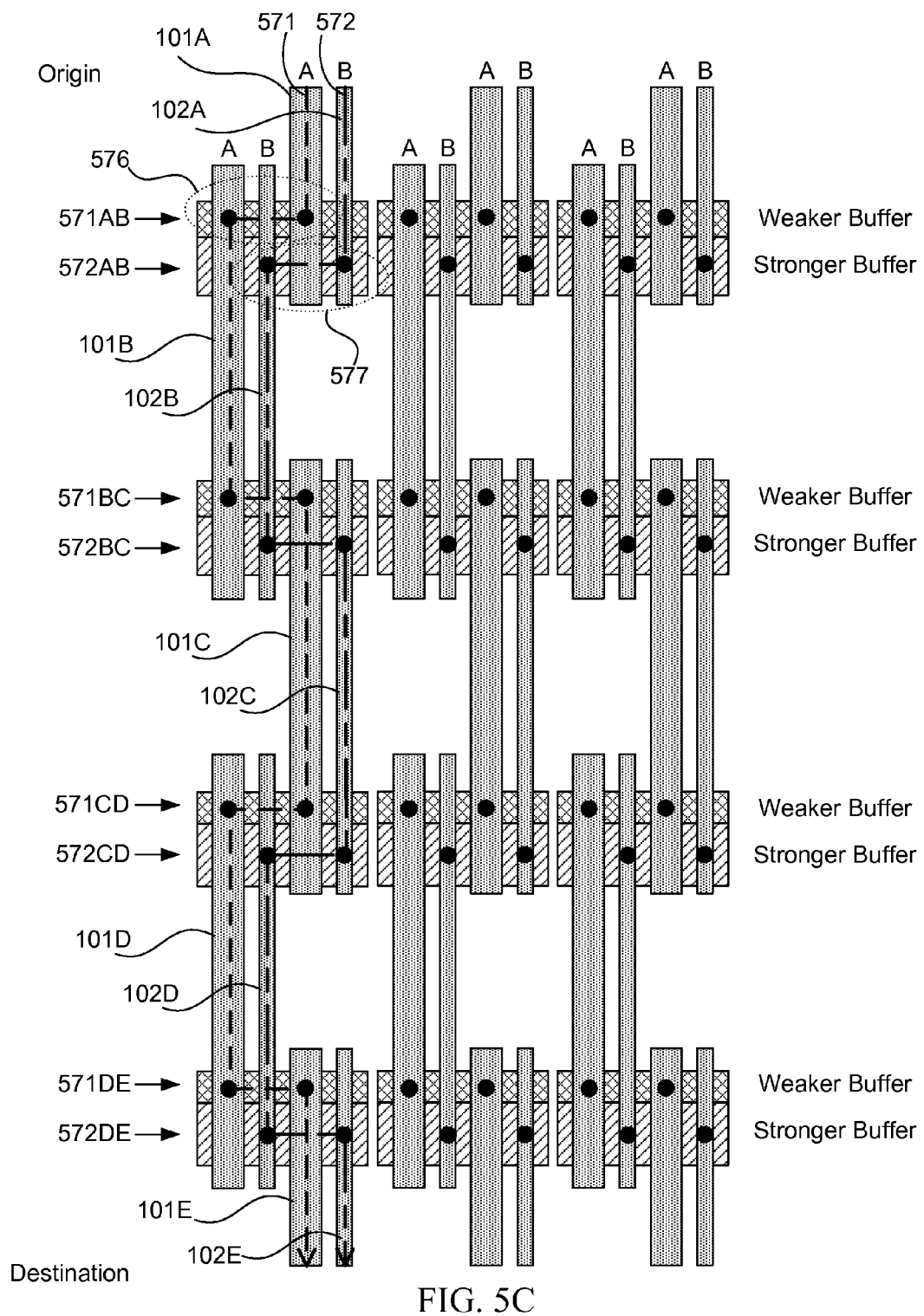
FIG. 5C is a planar view showing both an example signal path on wires that a signal may travel on double-patterned signal tracks and the relative location of repeater banks according to an embodiment of the disclosure.

FIG. 5C is a planar view showing both an example signal path on wires that a signal may travel on double-patterned signal tracks and the relative location of repeater banks according to an embodiment of the disclosure. Aspects of the semiconductor device depicted in FIG. 5C may be similar or the same as depicted in FIGS. 1A-5B. FIG. 5B and FIG. 5C may differ only by repeater bank areas. In FIG. 5C, for example, signal tracks carrying "A wires" 101 may be faster than signal tracks carrying "B wires" 102. The "A wires" 101 may have a shorter RC time constant than the "B wires" 102. The wires may be in segments shown in FIG. 5C as 101A, 101B, 101C, 101D, 101E for "A wires" and 102A, 102B, 102C, 102D, 102E for "B wires." The segment lengths may be of a substantially equal length. A substantially equal length may be a length of a first segment within ten percent of a length of a second segment. Selected vias 576 for a weaker repeater bank 571AB and selected vias 577 for a stronger repeater bank 572AB are shown in FIG. 5B. The vias 576, 577 may be chosen to connect signal tracks of a given RC time constant with repeater banks of a given strength. The needed strength or weakness selection and appropriate via connection may be done based on determination, by measurement, of trench widths. The trench will be filled with metal to make an "A wire" or a "B wire."

A signal track carrying a wire may have a signal path transferred to another signal track carrying a wire at each repeater bank. In an embodiment, the signal path may be alternated by two signal tracks. The signal path may alternate between different "A wires" 101 or different "B wires" 102, transferring at repeater banks. In other embodiments, the signal path on "A wires" 101 and "B wires" 102 may be staggered in different ways such as an arrangement where signal paths include signal tracks where the transfer of a signal is to a signal track an even number away. As in FIG. 5C, the effect is that signal paths carrying signals may weave back and forth between different "A wires" 101 or different "B wires" 102, repowering at repeater banks along the way.

In an embodiment, the repeater banks may have different buffer strengths. The different buffer strengths may result from establishing different areas for each repeater bank. FIG. 5C depicts signal 571 traveling on "A wires" and signal 572 traveling on "B wires." The signal may repower at repeater banks along the way. Repeater banks 571AB, 571BC, 571CD, and 571DE may be weaker repeater banks connected to signal tracks with fast wires 101 and repeater banks 572AB, 572BC, 572CD, and 572DE may be stronger repeater banks connected to signal tracks with slow wires 102. The area of repeater banks connected to signal tracks with slow wires 102 may be greater than that of repeater banks connected to signal tracks with fast wires 101. In such embodiment, a signal traveling on "A wires" 101 may arrive at the final destination at a time statistically equivalent to a signal traveling on "B wires" 102.

As depicted in FIG. 5C, the signal path of example signal 571 may originate on an "A wire" 101A, transfer using weaker repeater bank 571AB to an "A wire" 101B, transfer using weaker repeater bank 571BC to an "A wire" 101C, transfer using weaker repeater bank 571CD to an "A wire" 101D, and transfer using weaker repeater bank 571DE to an "A wire" 101E where signal 571 ultimately reaches its destination. Similarly, the signal path of example signal 572 may originate on a "B wire" 102A, transfer using stronger repeater bank 572AB to a "B wire" 102B, transfer using stronger repeater bank 572BC to a "B wire" 102C, transfer using stronger repeater bank 572CD to a "B wire" 102D, and transfer using stronger repeater bank 572DE to a "B wire" 102E where signal 572 ultimately reaches its destination.

Figure 5D:
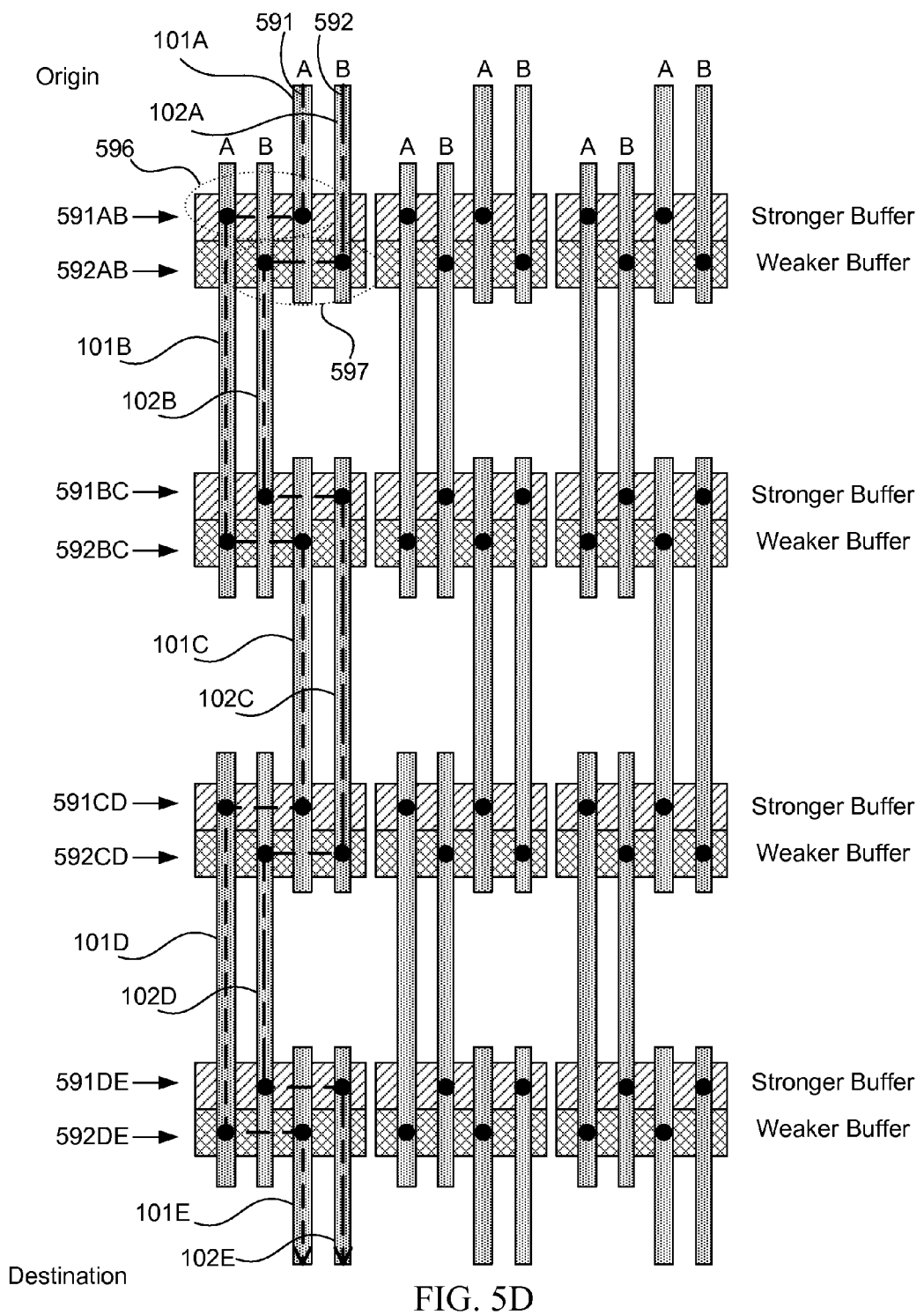
FIG. 5D is a planar view showing both an example signal path on wires that a signal may travel on double-patterned signal tracks and the relative location of repeater banks according to an embodiment of the disclosure.

FIG. 5D is a planar view showing both an example signal path on wires that a signal may travel on double-patterned signal tracks and the relative location of repeater banks according to an embodiment of the disclosure. Aspects of the semiconductor device depicted in FIG. 5D may be similar or the same as depicted in FIGS. 1A-5C. FIG. In FIG. 5C, for example, signal tracks carrying "A wires" 101 may be substantially equal in speed to signal tracks carrying "B wires" 102. The "A wires" 101 may have a substantially equal RC time constant compared to the "B wires" 102. The wires may be in segments shown in FIG. 5D as 101A, 101B, 101C, 101D, 101E for "A wires" and 102A, 102B, 102C, 102D, 102E for "B wires." The segment lengths may be of a substantially equal length. A substantially equal length may be a length of a first segment within ten percent of a length of a second segment. Selected vias 596 for a stronger repeater bank 591AB and selected vias 597 for a weaker repeater bank 592AB are shown in FIG. 5D. The vias 596, 597 may be chosen to connect signal tracks of a given RC time constant with repeater banks of a given strength. The needed strength or weakness selection and appropriate via connection may be done based on determination, by measurement, of trench or trough widths. The trench or trough will be filled with metal to make an "A wire" or a "B wire."

A signal track carrying a wire may have a signal path transferred to another signal track carrying a wire at each repeater bank. The signal path may alternate between different "A wires" 101 or different "B wires" 102, transferring at repeater banks. In other embodiments, the signal path on "A wires" 101 and "B wires" 102 may be staggered in different ways. As in FIG. 5D, the effect is that signal paths carrying signals may weave back and forth between different "A wires" 101 or different "B wires" 102, repowering at repeater banks along the way. In an embodiment, the repeater banks may have different buffer strengths with signals able to repower at repeater banks along the way. Repeater banks 591AB, 591BC, 591CD, and 591DE may be stronger repeater banks and repeater banks 592AB, 592BC, 592CD, and 592DE may be weaker repeater banks. In such embodiment, signal 591 may arrive at the final destination at a time statistically equivalent to signal 592.

As depicted in FIG. 5D, the signal path of example signal 591 may originate on an "A wire" 101A, transfer using stronger repeater bank 591AB to an "A wire" 101B, transfer using weaker repeater bank 592BC to an "A wire" 101C, transfer using stronger repeater bank 591CD to an "A wire" 101D, and transfer using weaker repeater bank 592DE to an "A wire" 101E where signal 591 ultimately reaches its destination. Similarly, the signal path of example signal 592 may originate on a "B wire" 102A, transfer using weaker repeater bank 592AB to a "B wire" 102B, transfer using stronger repeater bank 591BC to a "B wire" 102C, transfer using weaker repeater bank 592CD to a "B wire" 102D, and transfer using stronger repeater bank 591DE to a "B wire" 102E where signal 592 ultimately reaches its destination.

Two signal paths, each carrying a signal, traveling on "A wires" 101 and "B wires" 102 with stronger and weaker repeater banks may result in the signals traveling the same distance in a nearly equivalent amount of time as each other. FIG. 5B, FIG. 5C, and FIG. 5D show first signals 541, 571, 591 and second signals 542, 572, 592 may arrive at the destination at a nearly equivalent time. Such signal travel may occur without excessively stressing a high RC wire.

Aspects of the semiconductor device as depicted in FIGS. 1A-5D may include other characteristics according to other embodiments. Connections may be made at a different pattern design levels or layers according to embodiments. Signal paths may include multiple layers. Repowering may occur on multiple layers in this context as well. A signal may transfer from a signal track on a first signal conductor layer to a signal track on a second signal conductor layer using vias and higher level metals or other techniques. The transfer may occur in a similar fashion as shown in the illustrations. As such, the signal may be transferred multiple times in traveling from an origin to a destination. Such back and forth between signal tracks may occur across the semiconductor device between multiple layers. Other configurations and possibilities are considered with other embodiments.

Figure 6:
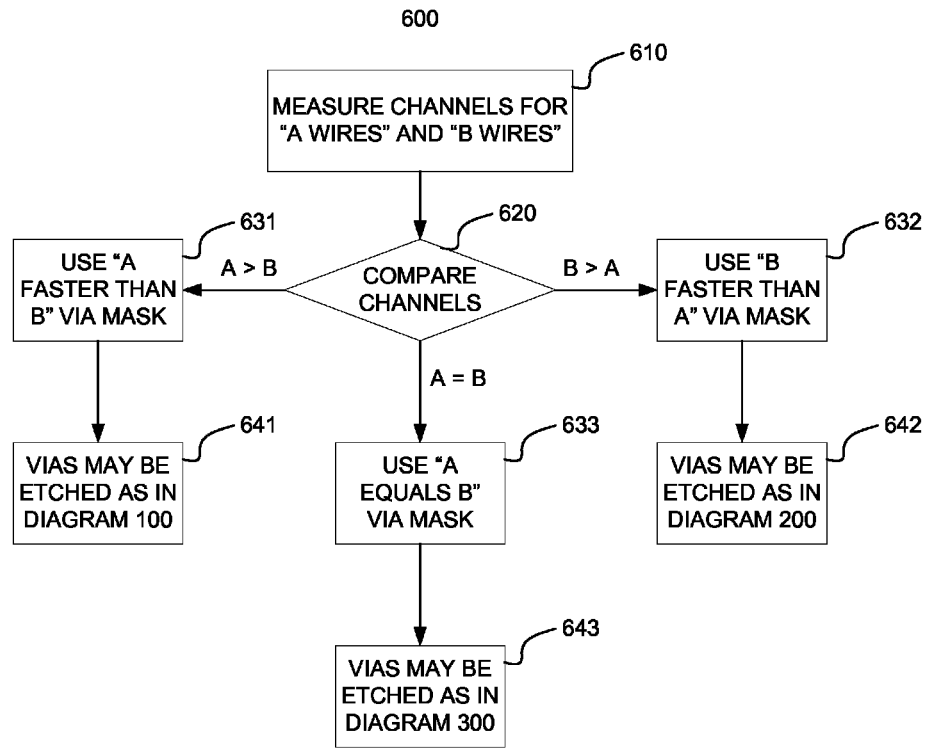
FIG. 6 is a flow chart showing an operation to choose via masks in accordance with an embodiment.

FIG. 6 is a flow chart showing an operation to choose via masks in accordance with an embodiment. Wire channels or tracings for wire channels created by masks for "A wires" and "B wires" may be measured as in block 610. A measurement in block 610 may include measuring the width of a trench or trough. Trench, trough, and channel may be synonymous. The measurement in block 610 may be performed before a via etch. The measurement in block 610 may be performed before via or metal depositions. Measurements from block 610 may be used to compare channels created by masks for "A wires" and "B wires" in block 620. The largest measurement from block 610 of the width of a trench or trough may be considered faster in decision block 620. The smallest measurement from block 610 of the width of a trench or trough may be considered slower in decision block 620. Thus, a channel with a larger width may be faster than a channel with a smaller width.

In an embodiment, a via mask may be chosen based on a comparison of channels. Via etching may occur in accordance with embodiments as described in FIGS. 1A-5D. If channels for "A wires" are larger than channels for "B wires" then an "A faster than B" via mask may be used as in block 631. Through use of an "A faster than B" via mask, vias may be etched in accordance with semiconductor device wiring 100 as in block 641. If channels for "B wires" are larger than channels for "A wires" then a "B faster than A" via mask may be used as in block 632. Through use of a "B faster than A" via mask, vias may be etched in accordance with semiconductor device wiring 200 as in block 642. If channels for "A wires" are equal to channels for "B wires" then an "A equals B" via mask may be used as in block 633. Through use of an "A equals B" via mask, vias may be etched in accordance with semiconductor device wiring 300 as in block 643.

Figure 7:
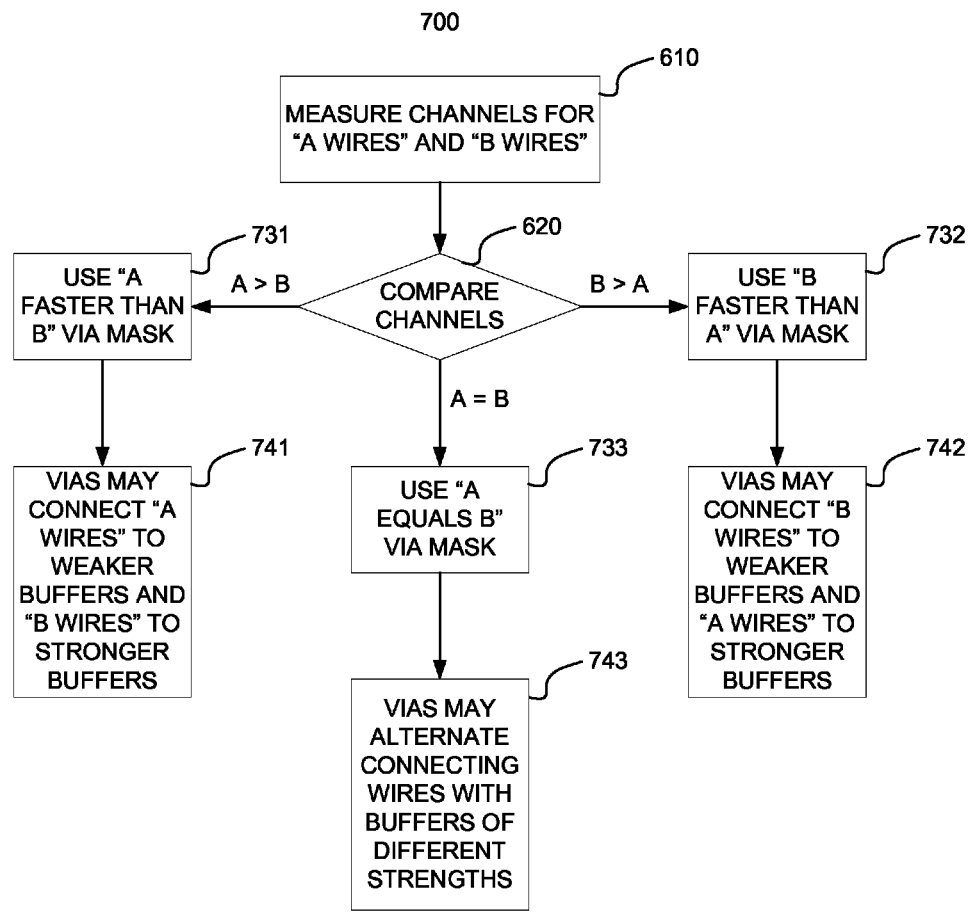
FIG. 7 is a flow chart showing an operation to choose via masks in accordance with an embodiment.

FIG. 7 is a flow chart showing an operation to choose via masks in accordance with an embodiment. Operation 700 is similar to operation 600. Operation 700 may differ from operation 600 after decision block 620. Via masks as in blocks 731, 732, 733 may differ from via masks of blocks 631, 632, 633 of operation 600. Via etching may occur in accordance with a semiconductor device wiring utilizing buffers of different strengths as in blocks 741, 742, 743 similar to illustration 500.

If channels for "A wires" are larger than channels for "B wires" then an "A faster than B" via mask may be used as in block 731. Through use of an "A faster than B" via mask, vias may be etched in accordance with illustration 500 as in block 741. Vias may connect the faster "A wires" to weaker buffers and the slower "B wires" to stronger buffers as described in block 741. If channels for "B wires" are larger than channels for "A wires" then a "B faster than A" via mask may be used as in block 732. Through use of a "B faster than A" via mask, vias may be etched with similar methodology to illustration 500 as in block 742. Vias may connect the faster "B wires" to weaker buffers and the slower "B wires" to stronger buffers as described in block 741. If channels for "A wires" are equal to channels for "B wires" then an "A equals B" via mask may be used as in block 733. Through use of an "A equals B" via mask, vias may be etched with similar methodology to illustration 300. Vias may alternate connecting wires with buffers of different strengths as in block 743 so that the signals reach the final destination at the same time. Other embodiments and variations on embodiments are contemplated.

What is claimed is:

1. A semiconductor device, comprising:
   a signal conductor layer having a first signal track set defined by a first mask and a second signal track set defined by a second mask,
   the first signal track set having a first quality characteristic and the second signal track set having a second quality characteristic;
   a first signal path comprising:
   a plurality of selectable repowering blocks of a first strength and a plurality of selectable repowering blocks of a second strength, the first strength greater than the second strength;
   a first signal track segment, a second signal track segment, and a third signal track segment from the first signal track set;
   a first repowering block adapted to transfer the first signal path from the first signal track segment to the second signal track segment;
   a second repowering block adapted to transfer the first signal path from the second signal track segment to the third signal track segment;
   when the second quality characteristic is greater than the first quality characteristic selecting the first and second repowering blocks to be of the first strength, when the first quality characteristic is greater than the second quality characteristic selecting the first and second repowering blocks to be of the second strength, and when the second quality characteristic is substantially equal to the first quality characteristic selecting the first repowering block to be of the first strength and the second repowering block to be of the second strength.

2. The semiconductor device of claim 1, further comprising a second signal path comprising:
   a plurality of selectable repowering blocks of the first strength and a plurality of selectable repowering blocks of the second strength;
   a fourth signal track segment, a fifth signal track segment, and a sixth signal track segment from the second signal track set;
   a third repowering block adapted to transfer the second signal path from the fourth signal track segment to the fifth signal track segment;
   a fourth repowering block adapted to transfer the second signal path from the fifth signal track segment to the sixth signal track segment;
   when the first quality characteristic is greater than the second quality characteristic selecting the first and second repowering blocks to be of the first strength, when the second quality characteristic is greater than the first quality characteristic selecting the first and second repowering blocks to be of the second strength, and when the first quality characteristic is substantially equal to the second quality characteristic selecting the first repowering block to be of the second strength and the second repowering block to be of the first strength.

3. The semiconductor device of claim 2, wherein the first signal path and the second signal path are adapted to achieve a timing tolerance standard that includes a difference in an amount of time between the first signal path to carry a first signal a distance and the second signal path to carry a second signal the distance.

4. The semiconductor device of claim 1, wherein the quality characteristic includes a width value, and wherein the width value is a measurement of a trough.

5. The semiconductor device of claim 1, wherein at least one of the first repowering block and the second repowering block includes a buffer circuit to repower a signal.

6. The semiconductor device of claim 1, wherein a repowering block of the first strength includes a larger FET width value than a repowering block of the second strength.

7. The semiconductor device of claim 1, wherein a repowering block of a first strength includes a lesser transistor threshold voltage value than a repowering block of the second strength.

8. The semiconductor device of claim 1, wherein a repowering block of a first strength includes a greater area value than a repowering block of the second strength, and wherein the area value is directly proportional to a quantity of repeater finger connectors.

9. The semiconductor device of claim 1, wherein the first signal track segment, the second signal track segment, and the third signal track segment are a first substantially equal length.

10. The semiconductor device of claim 2, wherein the fourth signal track segment, the fifth signal track segment, and the sixth signal track segment are a second substantially equal length.

11. The semiconductor device of claim 2, wherein the first signal track segment, the second signal track segment, the third signal track segment, the fourth signal track segment, the fifth signal track segment, and the sixth signal track segment are a third substantially equal length.

\* \* \* \* \*